(12) United States Patent
Sakai et al.

(10) Patent No.: US 9,608,618 B2
(45) Date of Patent: Mar. 28, 2017

(54) GATE DRIVING CIRCUIT INCLUDING A TEMPERATURE DETECTION CIRCUIT FOR REDUCING SWITCHING LOSS AND SWITCHING NOISE

(71) Applicant: Mitsubishi Electric Corporation, Chiyoda-ku (JP)

(72) Inventors: Takuya Sakai, Chiyoda-ku (JP); Hiroshi Nakatake, Chiyoda-ku (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/760,928

(22) PCT Filed: Jan. 29, 2014

(86) PCT No.: PCT/JP2014/051948
§ 371 (c)(1),
(2) Date: Jul. 14, 2015

(87) PCT Pub. No.: WO2014/123046
PCT Pub. Date: Aug. 14, 2014

(65) Prior Publication Data
US 2015/0358013 A1    Dec. 10, 2015

(30) Foreign Application Priority Data
Feb. 8, 2013    (JP) ................................. 2013-022789

(51) Int. Cl.
*H03K 3/00*    (2006.01)
*H03K 17/14*    (2006.01)
(Continued)

(52) U.S. Cl.
CPC ....... *H03K 17/145* (2013.01); *H03K 17/0828* (2013.01); *H03K 17/14* (2013.01); *H03K 17/161* (2013.01); *H03K 2017/0806* (2013.01)

(58) Field of Classification Search
CPC ........................... H03K 17/145; H03K 17/161
(Continued)

(56) References Cited

U.S. PATENT DOCUMENTS 5,100,829 A * 3/1992 Fay ..................... H01L 27/0248
257/337
8,508,258 B2 * 8/2013 Ishikawa ............. H01L 27/0248
327/108
(Continued)

FOREIGN PATENT DOCUMENTS

JP    56-135963 A    10/1981
JP    11-337381 A    12/1999
(Continued)

OTHER PUBLICATIONS

International Search Report issued Apr. 8, 2014, in PCT/JP2014/051948, filed Jan. 29, 2014.
(Continued)

*Primary Examiner* — Kenneth B Wells
(74) *Attorney, Agent, or Firm* — Oblon, McClelland, Maier & Neustadt, L.L.P.

(57) ABSTRACT

A temperature detection circuit for detecting a temperature of a switching element, a current source for causing a forward current to flow to the temperature detection circuit, an amplifier circuit for amplifying a forward voltage of the temperature detection circuit, a current adjustment circuit for adjusting a magnitude of a gate current to the switching element on the basis of an output voltage of the amplifier circuit, and a drive circuit for receiving an external signal and turning ON/OFF the switching element, are included. The magnitude of the gate current caused to flow from the current adjustment circuit to the gate electrode of the switching element is adjusted on the basis of a change in a
(Continued)

magnitude of the forward voltage corresponding to a change in the temperature of the temperature detection circuit.

9 Claims, 7 Drawing Sheets

(51) Int. Cl.
*H03K 17/16* (2006.01)
*H03K 17/082* (2006.01)
*H03K 17/08* (2006.01)

(58) Field of Classification Search
USPC .......................................................... 327/108
See application file for complete search history.

(56) References Cited

U.S. PATENT DOCUMENTS

| | | | |
|---|---|---|---|
| 8,970,259 B2* | 3/2015 | Mori | H03K 17/145 327/108 |
| 2002/0118502 A1 | 8/2002 | Yabe et al. | |
| 2006/0244496 A1* | 11/2006 | Kawakita | F02P 3/0552 327/110 |
| 2007/0221994 A1 | 9/2007 | Ishikawa et al. | |
| 2008/0198526 A1 | 8/2008 | Hiyama | |
| 2012/0126858 A1 | 5/2012 | Senda et al. | |
| 2012/0242376 A1 | 9/2012 | Ose et al. | |
| 2013/0285732 A1 | 10/2013 | Mori | |

FOREIGN PATENT DOCUMENTS

| | | |
|---|---|---|
| JP | 2004-117111 A | 4/2004 |
| JP | 2007-82351 A | 3/2007 |
| JP | 2007-089325 A | 4/2007 |
| JP | 2007-259576 A | 10/2007 |
| JP | 2008-206348 A | 9/2008 |
| JP | 2009-257790 A | 11/2009 |
| JP | 2012-114587 A | 6/2012 |
| JP | 2012-222681 A | 11/2012 |
| JP | 2013-219633 A | 10/2013 |

OTHER PUBLICATIONS

Extended European Search Report issued Sep. 6, 2016 in Patent Application No. 14748682.3.
Japanese Office Action issued Aug. 2, 2016 in Patent Application No. 2014-560736 (with partial English translation).

* cited by examiner

GATE DRIVING CIRCUIT INCLUDING A TEMPERATURE DETECTION CIRCUIT FOR REDUCING SWITCHING LOSS AND SWITCHING NOISE

TECHNICAL FIELD

The present invention relates to a gate driving circuit which drives a semiconductor switching element as a power conversion semiconductor element.

BACKGROUND ART

As a gate driving circuit which drives a semiconductor switching element (hereinafter, referred to merely as switching element) as a power conversion semiconductor element, for example, the following gate driving circuit has been hitherto proposed. Specifically, in the conventional technique, in the case where a switching element is driven by a constant current source, a detection voltage Ve obtained from a gate current Ic flowing from the constant current source via a shunt resistor to the gate of the switching element and a resistance value Rout of the shunt resistor is compared to a reference voltage Vref of a reference power supply by an operational amplifier, and feedback control of the gate current Ic is performed such that Ve is always equal to Vref, thereby reducing variation of a constant current (e.g., see Patent Document 1 described below).

CITATION LIST

Patent Document

Patent Document 1: Japanese Laid-Open Patent Publication No. 2012-114587

SUMMARY OF THE INVENTION

Problems to be Solved by the Invention

Meanwhile, in the case where the switching element is driven by such a gate driving circuit, switching loss and switching noise which occur in connection with a switching operation have a trade-off relationship. Thus, in order to achieve both reduction of switching loss and reduction of switching noise, it is necessary to control a gate resistance or a gate voltage according to conditions (e.g., a current value, a temperature, etc.) for driving the switching element, to adjust the value of a gate current to the switching element.

Hitherto, in a gate driving circuit which drives a switching element with a constant current, a temperature near the switching element is detected, and if an abnormality is detected, a protection operation such as stopping a switching operation is performed. However, control regarding change of a driving state, such as adjusting the value of a gate current to the switching element according to conditions (e.g., a current value, a temperature, etc.) for driving the switching element, has not been performed. Therefore, for example, due to a change in the temperature near the switching element, switching loss excessively increases so that the element breaks, or switching noise excessively occurs, and thus it is difficult to achieve both reduction of switching loss and reduction of switching noise.

The present invention has been made to solve the above-described problem, and an object of the present invention is to provide a gate driving circuit which is configured to be able to perform control of adjusting a gate current to a switching element in accordance with a change in a temperature condition or the like when the switching element is driven, thereby automatically achieving both reduction of switching loss and reduction of switching noise.

Solution to the Problems

A gate driving circuit according to the present invention is a gate driving circuit for driving a power conversion switching element by charging and discharging a gate electrode of the switching element. The gate driving circuit includes: a temperature detection circuit for detecting a temperature of the switching element; a current source for causing a forward current to flow to the temperature detection circuit; an amplifier circuit for amplifying a forward voltage of the temperature detection circuit; a current adjustment circuit for adjusting a magnitude of a gate current caused to flow to a gate electrode of the switching element, on the basis of an output voltage of the amplifier circuit; and a drive circuit for receiving an external signal and turning ON/OFF the switching element. The magnitude of the gate current caused to flow from the current adjustment circuit to the gate electrode of the switching element is adjusted on the basis of a change in a magnitude of the forward voltage corresponding to a change in the temperature of the temperature detection circuit.

Effect of the Invention

In the gate driving circuit according to the present invention, if the temperature of the switching element is low and switching loss is acceptable, control is performed such that the gate current to the switching element decreases, to decrease the switching speed of the switching element, thereby suppressing occurrence of switching noise. In addition, if the temperature of the switching element is high and switching loss is not acceptable, control is performed such that the gate current to the switching element increases, to increase the switching speed of the switching element, whereby it is possible to suppress an increase in switching loss.

Therefore, it is possible to automatically achieve both reduction of switching loss and reduction of switching noise. In addition, it is possible to configure a temperature detection circuit and a current adjustment circuit which adjusts a gate current, with a smaller number of elements than that in the conventional art, and it is possible to accurately adjust the value of the gate current.

DESCRIPTION OF EMBODIMENTS

Embodiment 1

Figure 1:
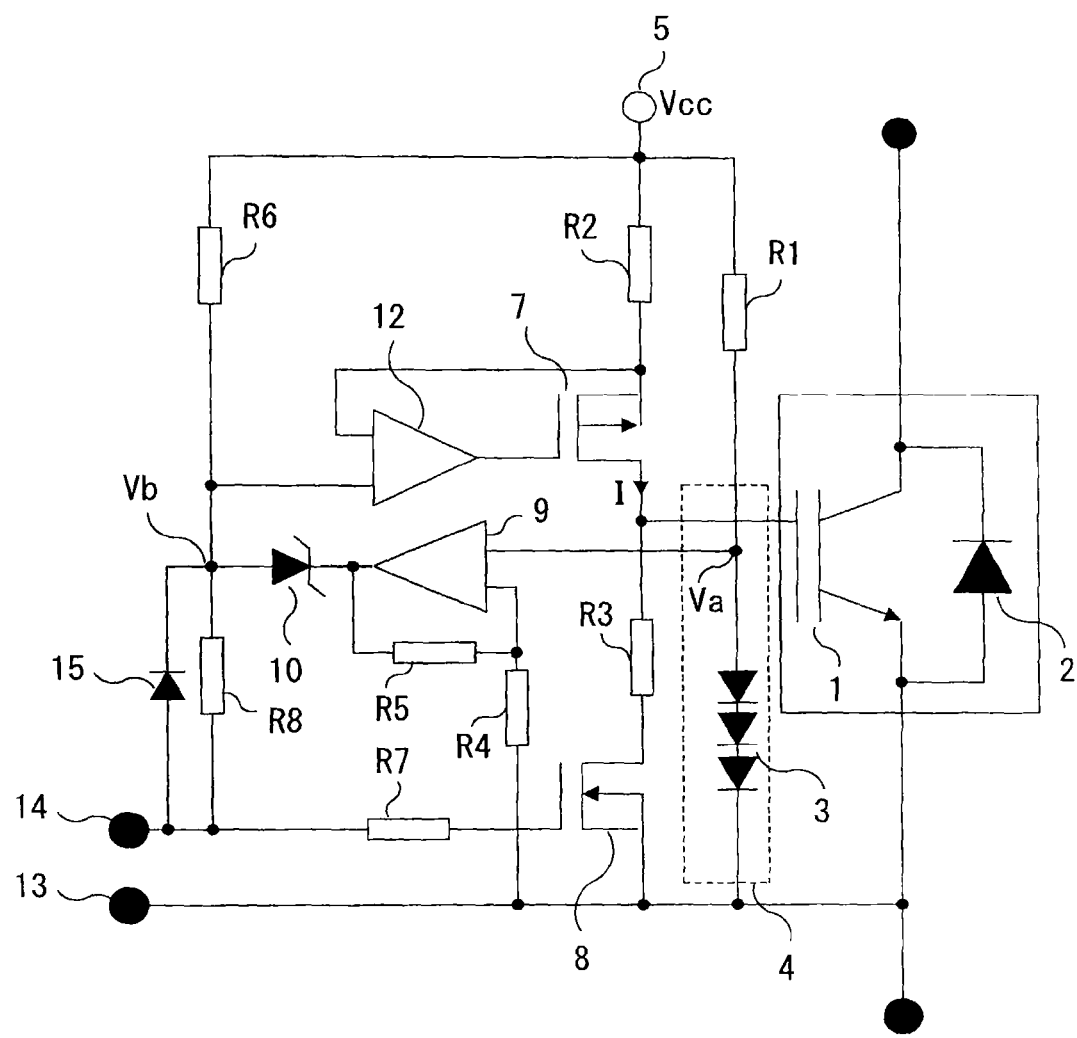
FIG. 1 is a circuit diagram showing a gate driving circuit according to Embodiment 1 of the present invention.

FIG. 1 is a circuit diagram showing a gate driving circuit according to Embodiment 1 of the present invention.

The gate driving circuit of Embodiment 1 includes a power conversion switching element 1 composed of an IGBT (Insulated Gate Bipolar Transistor) which forms, for example, a converter or an inverter, and a free wheel diode 2 is connected in antiparallel with the switching element 1. It should be noted that, other than the IGBT, a semiconductor element such as a power MOSFET (Metal Oxide Semiconductor Field Effect Transistor), a bipolar transistor, or a GTO (Gate Turn Off thyristor) may be used as the switching element 1.

A temperature detection circuit 4 is provided on a chip having the switching element 1 and the diode 2 formed thereon, and at a position near the switching element 1 and the diode 2, where there is almost no temperature difference from the switching element 1 and the diode 2. The temperature detection circuit 4 includes a plurality of diodes 3 connected in series. One end of the temperature detection circuit 4 is connected to a control power supply 5 via a current limiting resistor R1, and the other end of the temperature detection circuit 4 is connected to a ground side terminal 13. The control power supply 5 corresponds to a current source for causing a forward current to flow to the temperature detection circuit 4.

Figure 2:
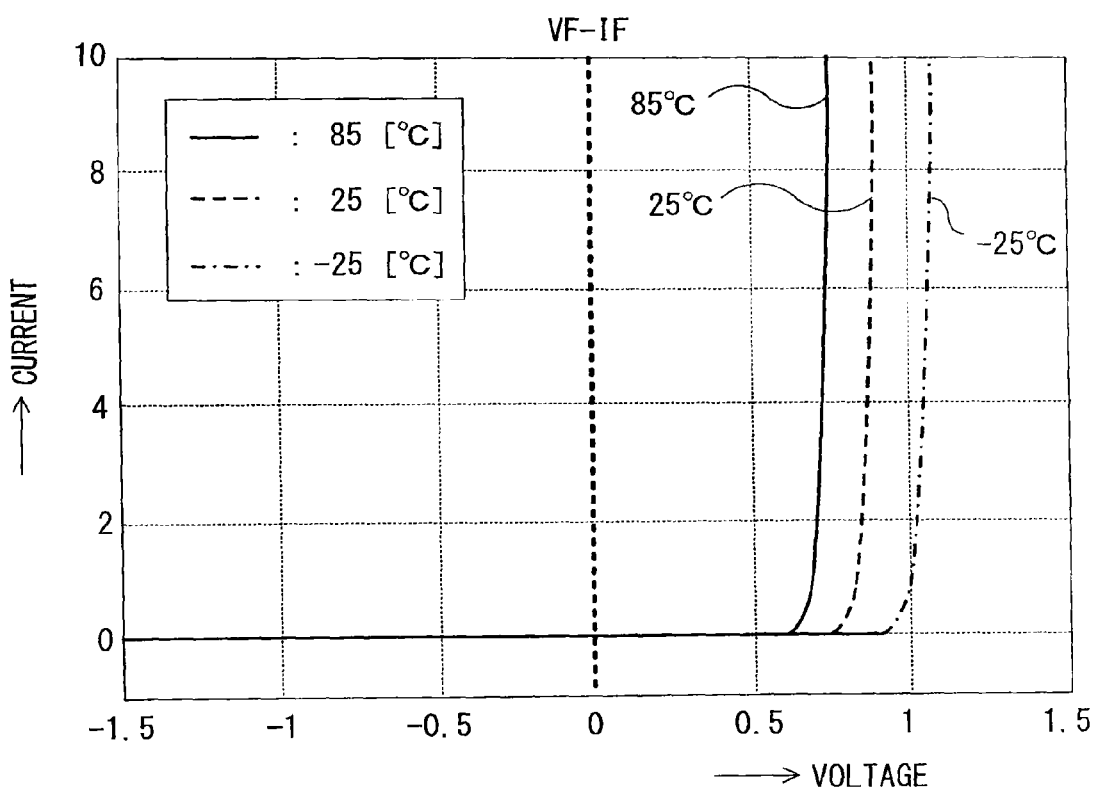
FIG. 2 is a characteristic diagram showing a voltage-current relationship of each diode forming a temperature detection circuit of the gate driving circuit according to Embodiment 1 of the present invention.

Here, the output characteristics of the diodes 3, which form the temperature detection circuit 4, are shown in FIG. 2, which are well known. Therefore, by obtaining beforehand temperature dependency of voltage-current characteristics of the diodes 3 as shown in FIG. 2, it is possible to detect the temperature of the switching element 1 by the temperature detection circuit 4.

To the gate side of the switching element 1, the control power supply 5, a current limiting resistor R2, a P-channel type MOSFET 7 for causing a gate current to flow to a gate electrode of the switching element 1 to charge the switching element 1, a current limiting resistor R3, and an N-channel type MOSFET 8 for stopping supply of the gate current to the gate electrode of the switching element 1 to discharge the switching element 1 are sequentially connected. The source side of the MOSFET 8 is connected to the ground side terminal 13. It should be noted that a voltage Vcc of the control power supply 5 is adjusted to a constant voltage in order to drive the switching element 1.

One input terminal of a first operational amplifier 9 is connected to a connection point between the current limiting resistor R1 and the current input side of the temperature detection circuit 4. The other input terminal of the first operational amplifier 9 is connected to the ground side terminal 13 via a resistor R4. A Zener diode 10 is connected to the output terminal of the first operational amplifier 9. It should be noted that a resistor R5 is a feedback resistor for the first operational amplifier 9. The first operational amplifier 9 corresponds to an amplifier circuit for amplifying a forward voltage of the temperature detection circuit 4.

One input terminal of a second operational amplifier 12 is connected to a connection point between the current limiting resistor R2 and the source of the MOSFET 7. A voltage adjustment resistor R6 is connected to the control power supply 5, and the other input terminal of the second operational amplifier 12 is connected to a connection point between the resistor R6 and the Zener diode 10. The output terminal of the second operational amplifier 12 is connected to the gate of the MOSFET 7. The second operational amplifier 12 and the MOSFET 7 correspond to a current adjustment circuit for adjusting a magnitude of a gate current I caused to flow to the gate electrode of the switching element 1.

Reference character 14 denotes an input terminal for a control signal inputted from the outside for performing ON/OFF control of the switching element 1. The input terminal 14 is connected to the gate of the MOSFET 8 via a resistor R7, and is also connected to the connection point between the resistor R6 and the Zener diode 10 via a resistor R8 and a diode 15. Both MOSFETs 7 and 8 correspond to a drive circuit for receiving an external signal and turning ON/OFF the switching element 1.

A basic operation in the case where ON/OFF control of the switching element 1 is performed on the basis of a control signal inputted from the outside to the input terminal 14 in the gate driving circuit having the above configuration, will be initially described.

First, the case where a control signal having an L level, that is, having the same voltage as that of the ground side terminal 13, is inputted to the input terminal 14 will be described. In this case, the MOSFET 8 is turned OFF, and the second operational amplifier 12: controls a gate voltage of the MOSFET 7 such that a voltage difference is the same between the input terminals, that is, a potential which is obtained by subtracting a voltage drop caused by the gate current and the resistor R2 from the potential Vcc of the control power supply 5 and is inputted to the one input terminal is the same as a potential difference between a potential of Vb and the potential Vcc of the control power supply 5 which is inputted to the other input terminal; and adjusts an ON resistance of the MOSFET 7, thereby controlling the magnitude of the gate current. In this manner, the gate current I is supplied from the control power supply 5 via the resistor R2 and the MOSFET 7 to the gate electrode of the switching element 1, so that the switching element 1 is turned ON.

Next, the case where a control signal having an H level with the same potential as the potential Vcc of the control power supply 5 is inputted to the input terminal 14, will be described. In this case, the MOSFET 8 is turned ON, and the voltage difference between the input terminals of the second operational amplifier 12 is eliminated, whereby the second operational amplifier 12 turns OFF the MOSFET 7 such that a current does not flow in the resistor R2. Thus, the gate current I is not supplied from the control power supply 5 to the gate electrode of the switching element 1, so that the switching element 1 is turned OFF.

Next, an operation of adjusting the gate current I on the basis of detection of the temperature near the switching element 1 by the temperature detection circuit 4 will be described.

As the temperature dependency of the voltage-current characteristics of the diodes 3 which form the temperature detection circuit 4, if a cathode current of each diode 3 is constant, a voltage between an anode and a cathode changes in response to the temperature as shown in FIG. 2.

Figure 3:
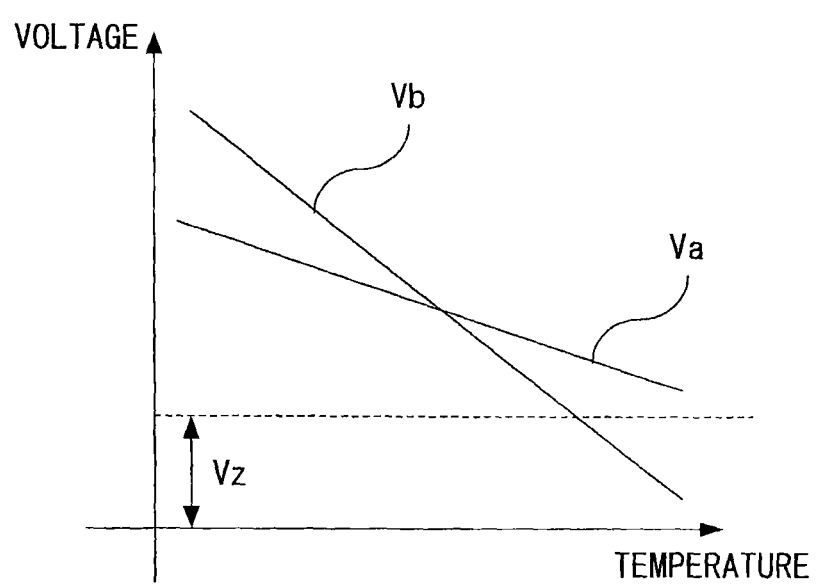
FIG. 3 is a characteristic diagram showing temperature dependency of an input voltage and an output voltage of an amplifier circuit of the gate driving circuit according to Embodiment 1 of the present invention.

Thus, a forward voltage Va of the temperature detection circuit 4 is amplified by the first operational amplifier 9. As shown in FIG. 3, a threshold voltage component Vz of the Zener diode 10 is an offset voltage for the output voltage of the first operational amplifier 9 after the amplification, and thus a voltage obtained by subtraction of the offset voltage Vz is used as a current adjustment voltage Vb for gate current adjustment. The current adjustment voltage Vb obtained by subtraction of the offset voltage Vz has a characteristic that the current adjustment voltage Vb increases as the temperature decreases, as seen from the characteristic in FIG. 3. It should be noted that for subtraction of the offset voltage Vz, other than the above method, an offset may be provided to the first operational amplifier 9, and subtraction of the offset may be performed.

If the temperature of the switching element 1 is low, the forward voltage Va of the temperature detection circuit 4 increases, and thus the first operational amplifier 9 adjusts the output voltage so as to increase the output voltage such that a voltage difference is the same between both input terminals of the first operational amplifier 9. Thus, the current adjustment voltage Vb is adjusted to be higher than a voltage obtained through division of the potential Vcc of the control power supply 5 by the resistor R6 and the resistor R8. As a result, the potential difference between the current adjustment voltage Vb of the second operational amplifier 12 and the potential Vcc of the control power supply 5 decreases, and thus the second operational amplifier 12 adjusts the gate voltage of the MOSFET 7 such that the ON resistance value of the MOSFET 7 increases, whereby the gate current I to the switching element 1 is controlled to decrease. Therefore, the switching speed of the switching element 1 decreases, and thus, although switching loss increases to some extent, a current change (di/dt) at that time decreases, whereby switching noise is reduced. That is, if the temperature of the switching element 1 is low and switching loss is acceptable, occurrence of switching noise is reduced.

On the other hand, if the temperature of the switching element 1 is high, the forward voltage Va of the temperature detection circuit 4 decreases, and thus the output voltage of the first operational amplifier 9 is adjusted to a voltage lower than that in the case where the temperature is low. As a result, the current adjustment voltage Vb is adjusted to be lower than the voltage obtained through division of the potential Vcc of the control power supply 5 by the resistor R6 and the resistor R8. Thus, the voltage difference between both input terminals of the second operational amplifier 12 is adjusted to increase, and hence the second operational amplifier 12 adjusts the gate voltage of the MOSFET 7 such that the ON resistance value of the MOSFET 7 decreases, whereby the gate current I to the switching element 1 is controlled to increase. Therefore, the switching speed of the switching element 1 increases, and thus, although a current change (di/dt) at that time increases and switching noise increases to some extent, switching loss is reduced. That is, if the temperature of the switching element 1 is high and switching loss is not acceptable, an increase in the switching loss is reduced.

It should be noted that for adjusting the gate current I on the basis of a change in the temperature of the switching element 1, it is also possible to adjust the gain of the first operational amplifier 9 or to connect a resistor, which is not shown, in series with the Zener diode 10.

In addition, the Zener diode 10 is configured to be disposed on the chip on which the switching element 1 is disposed, but is not limited thereto and may be disposed on another chip different from this chip. For example, the Zener diode 10 may be configured to be disposed near a radiation fin which cools the switching element 1. In the case of this configuration, if the ambient temperature changes, it is possible to detect a temperature difference acceptable to the switching element 1 by the Zener diode 10. This point will be described below.

In general, if a Zener diode 10 having a rated voltage of 5 V or higher is used, a positive characteristic is exhibited that the breakdown voltage of the Zener diode 10 increases if the temperature rises.

Therefore, if the ambient temperature is low and the radiation fin can accept switching loss, the breakdown voltage of the Zener diode 10 decreases at the same time, and thus the current adjustment voltage Vb is adjusted to increase. As a result, the potential difference between the current adjustment voltage Vb and the potential Vcc of the control power supply 5 decreases, and thus the gate current I to the switching element 1 is controlled to decrease by the current adjustment circuits 12 and 7.

On the other hand, if the ambient temperature is high and the radiation fin cannot accept switching loss, the breakdown voltage of the Zener diode 10 increases at the same time, and thus the current adjustment voltage Vb is adjusted to decrease. As a result, the potential difference between the current adjustment voltage Vb and the potential Vcc of the control power supply 5 increases, and thus the gate current I to the switching element 1 is controlled to increase by the current adjustment circuits 12 and 7.

Since the Zener diode 10 having a positive characteristic that, if the temperature rises, the breakdown voltage increases accordingly is used as described above, even if not only the chip temperature but also the ambient temperature and the temperature of the radiation fin or the like change, it is possible to provide a trade-off between switching loss and switching noise.

In the above description, by using the Zener diode 10 having a positive characteristic, control is performed such that if the ambient temperature rises, the gate current I to the switching element 1 increases. On the other hand, a Zener diode 10 having a rated voltage of 5 V or lower normally exhibits a negative characteristic. Thus, if such a Zener diode 10 having a negative characteristic is used, the breakdown voltage decreases as the temperature rises, and thus the current adjustment voltage Vb increases. As a result, the gate current I to the switching element 1 is controlled to decrease by the current adjustment circuits 12 and 7. In this manner, it is possible to adjust the tendency of correction of the gate current I on the basis of the characteristic of the Zener diode 10 to be used.

Next, relationships of a switching time and switching loss with respect to the gate current to or the gate resistance of the switching element 1 described above will be described in detail.

Figure 4A:
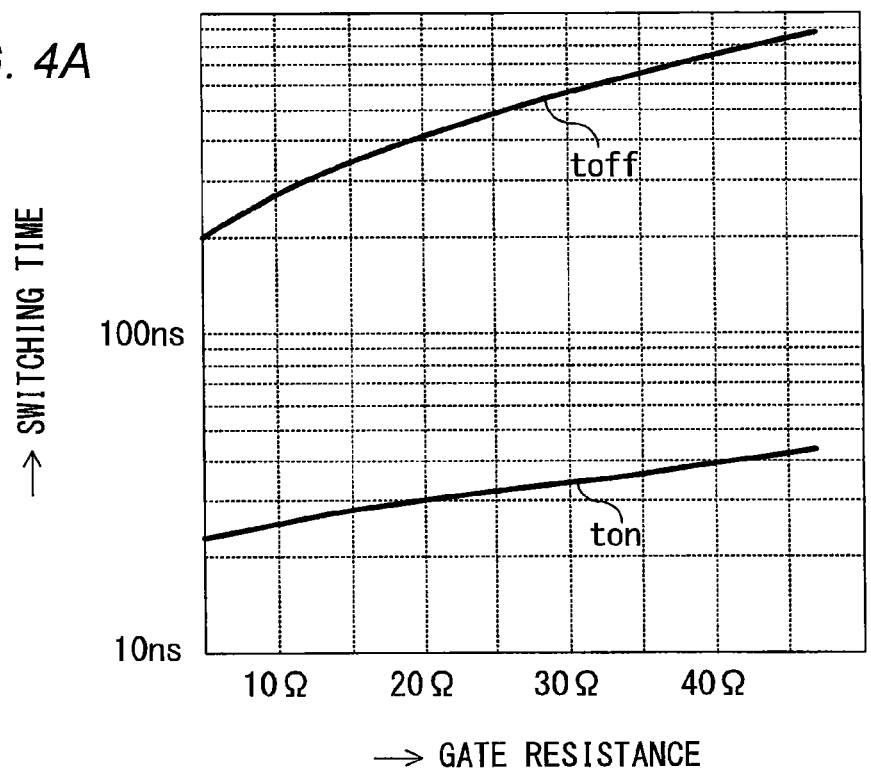
FIGS. 4A, 4B are characteristic diagrams showing relationships of a switching time and switching loss with respect to a gate resistance of a switching element.
Figure 4B:
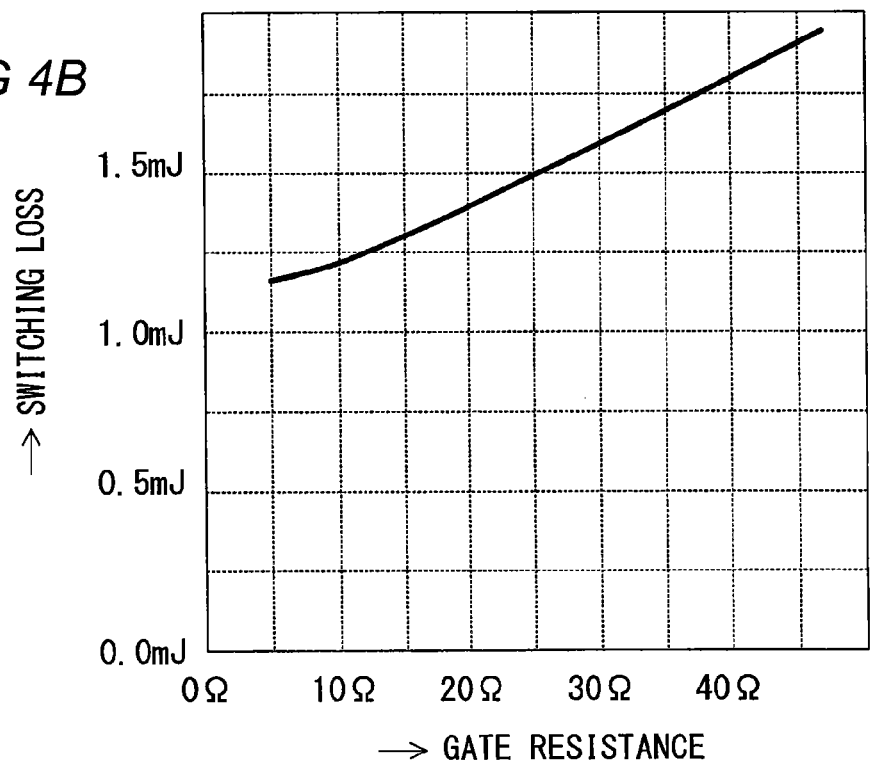

FIG. 4A shows a relationship between the gate resistance and the switching time of the switching element 1, and FIG. 4B shows a relationship between the gate resistance and the switching loss. In this case, the relationship between the gate resistance and the magnitude of the gate current is an inversely proportional relationship. If the gate resistance is low, the gate current is high. Here, the gate resistance corresponds to the ON resistance of the MOSFET 7.

If the temperature of the switching element 1 is low, although the switching loss of the switching element 1 increases to some extent, the junction temperature of the switching element 1 does not reach a breakdown level. Thus, the gate resistance of the switching element 1 is increased (i.e., the gate current I is decreased) to increase the switching time, whereby a current change (di/dt) decreases. As a result, it is possible to reduce occurrence of switching noise.

In addition, the relationship between the switching time of the switching element 1 and the magnitude of the switching noise is determined on the basis of an inductance value determined on the basis of the shape of a circuit to which the switching element 1 is connected, the magnitude of a current, or the like. In any of the cases, if the gate resistance of the switching element 1 is decreased (i.e., the gate current I is increased), the switching time decreases. Thus, the switching loss is reduced, but a current change (di/dt) when the switching element 1 is turned ON/OFF increases. As a result, generated switching noise increases.

Also regarding the temperature of the switching element 1, if the gate resistance is increased (i.e., the gate current I is decreased), the switching loss increases, and thus the temperature of the element also tends to increase, although the degree of the increase is different depending on a condition under which the switching element 1 is installed, a method for cooling, or the like.

Also regarding the gate voltage of the MOSFET 7 which forms the current adjustment circuit, although the characteristic is different depending on the element to be used, it is possible to control the value of the ON resistance between the source and the drain of the MOSFET 7 by controlling the gate voltage of the MOSFET 7.

From the standpoint of the above, in Embodiment 1, the ON resistance of the MOSFET 7 which corresponds to the output impedance of the current adjustment circuit is adjusted by the second operational amplifier 12 in accordance with change of a temperature condition when the switching element 1 is driven, to control the gate current I to the switching element 1, thereby automatically achieving both reduction of the switching loss and reduction of the switching noise.

That is, if the temperature of the switching element 1 is low, as shown in FIG. 4A, the gate voltage applied from the second operational amplifier 12 to the gate of the MOSFET 7 is decreased to change the ON resistance (gate resistance) of the MOSFET 7 from 10Ω to 40Ω to change the switching time upon turning on the switching element 1 from 25 ns to 43 ns or to change the switching time upon turning OFF the switching element 1 from 280 ns to 770 ns, thereby reducing noise occurring upon switching. However, as shown in FIG. 4B, loss upon switching increases from 1.2 mJ to 1.8 mJ. On the other hand, if the temperature of the switching element 1 is high, the gate voltage applied from the second operational amplifier 12 to the gate of the MOSFET 7 is increased to decrease the ON resistance (gate resistance) of the MOSFET 7 to shorten the switching time of the switching element 1, thereby reducing the switching loss.

As described above, in Embodiment 1, if the temperature of the switching element 1 is low and switching loss is acceptable, control is performed such that the gate current I to the switching element 1 decreases, to decrease the switching speed of the switching element 1, thereby suppressing occurrence of switching noise. In addition, if the temperature of the switching element 1 is high and switching loss is not acceptable, control is performed such that the gate current I to the switching element 1 increases, to increase the switching speed of the switching element 1, thereby suppressing an increase in the switching loss.

Thus, since it is possible to automatically achieve reduction of the switching loss and reduction of the switching noise of the switching element 1, it is possible to eliminate occurrence of a problem, such as excessive occurrence of switching noise or breakdown of the element due to an excessive increase in the switching loss which is caused due to change in the temperature near the switching element 1 as in the conventional art.

Embodiment 2

Figure 5:
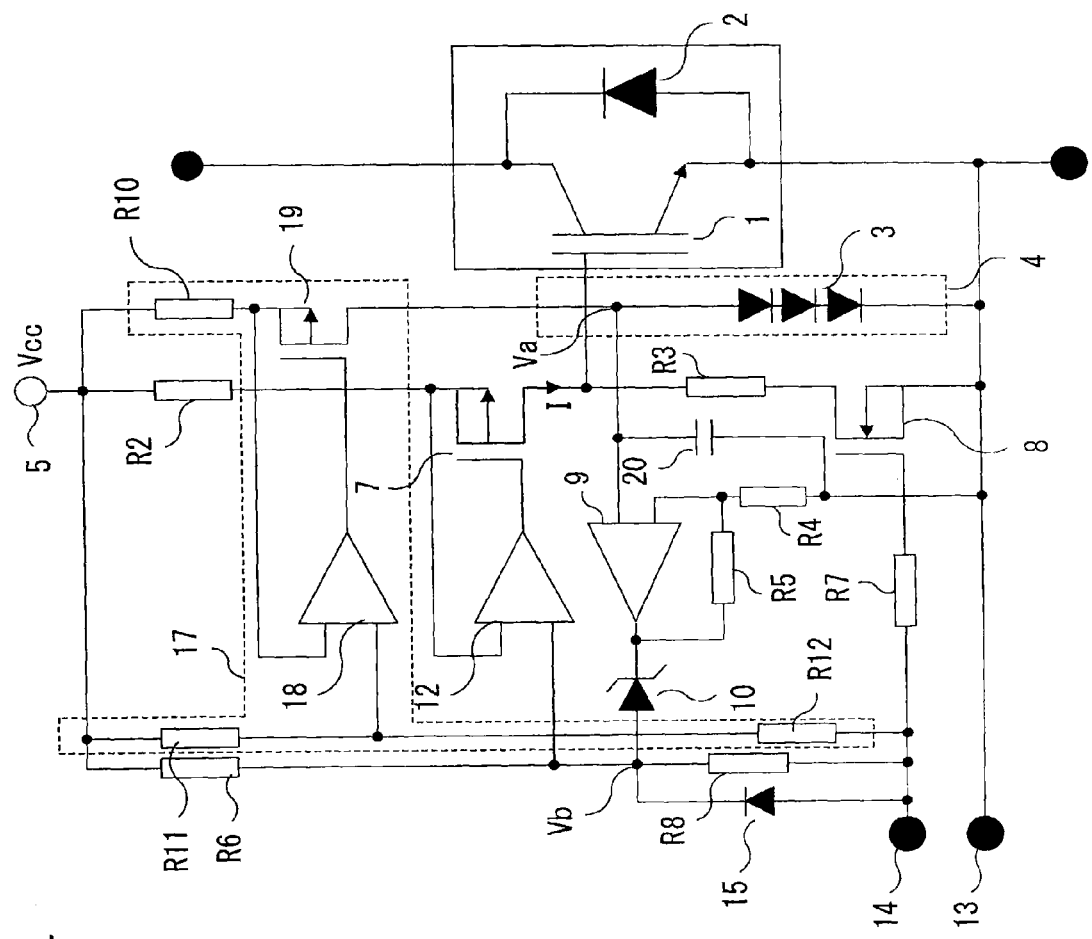
FIG. 5 is a circuit diagram showing a gate driving circuit according to Embodiment 2 of the present invention.

FIG. 5 is a circuit diagram showing a gate driving circuit according to Embodiment 2 of the present invention, and components that correspond to or are the same as those in Embodiment 1 shown in FIG. 1 are denoted by the same reference characters.

The power supply voltage Vcc of the control power supply 5 may vary due to a temperature change, noise from another circuit, or the like. If the power supply voltage Vcc varies, the forward voltage Va of the temperature detection circuit 4 varies accordingly, and the forward current to the diodes 3 varies. As a result, a temperature change cannot be accurately detected, and a drive state of the switching element 1 changes due to a condition other than the temperature.

In order to avoid such a problem, in Embodiment 2, a constant current generator 17 is provided. The constant current generator 17 causes a constant current to flow such that the magnitude of the forward current to the temperature detection circuit 4 is always constant. That is, the constant current generator 17 includes resistors R10 to R12 each having a known resistance value, a third operational amplifier 18, and a P-channel type MOSFET 19 which is a current adjustment semiconductor element.

The resistor R10 and the MOSFET 19, which form the constant current generator 17, are sequentially connected between the control power supply 5 and the temperature detection circuit 4. In addition, one input terminal of the third operational amplifier 18 is connected to a connection point between the resistor R10 and the drain of the MOSFET 19. Furthermore, the two resistors R11 and R12, which form the constant current generator 17, are connected in series between the control power supply 5 and the ground side terminal 13, and the other input terminal of the third operational amplifier 18 is connected to a connection point between both resistors R11 and R12.

Feedback control of a gate voltage of the current adjustment MOSFET 19 is performed such that voltage drops at the resistor R10 and R11 relative to the voltage Vcc of the control power supply 5 are the same, that is, voltages applied to both input terminals of the third operational amplifier 18 are the same. By so doing, adjustment is performed such that the magnitude of the forward current flowing to the temperature detection circuit 4 is always constant.

In addition, in Embodiment 2, a filter 20 is provided at a preceding stage of the one input terminal of the first operational amplifier 9 to reduce influence of external noise. Thus, it is possible to achieve stable operation.

The other configurations and operational effects are the same as those in Embodiment 1, and thus the detailed description thereof is omitted.

Embodiment 3

Figure 6:
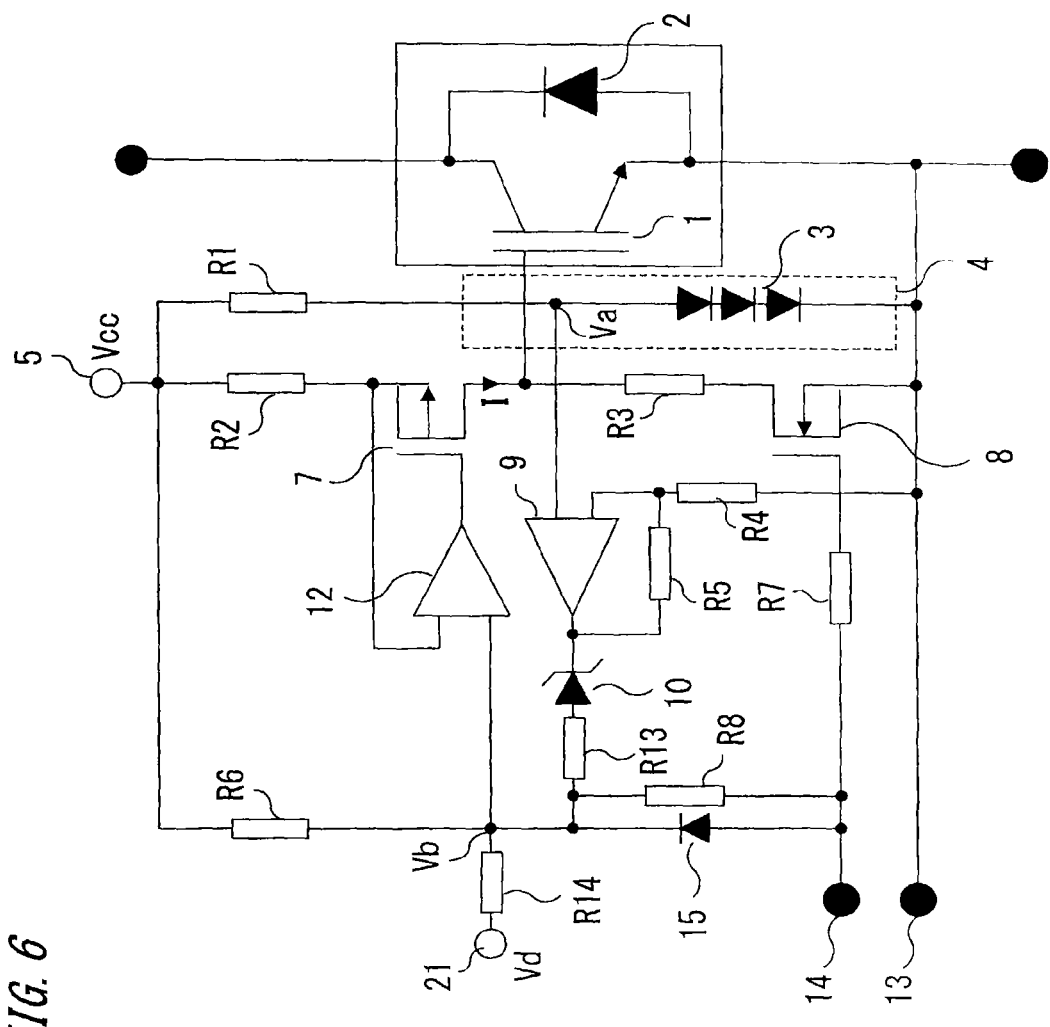
FIG. 6 is a circuit diagram showing a gate driving circuit according to Embodiment 3 of the present invention.

FIG. 6 is a circuit diagram showing a gate driving circuit according to Embodiment 3 of the present invention, and components that correspond to or are the same as these in Embodiment 1 shown in FIG. 1 are denoted by the same reference characters.

Embodiment 3 is different from Embodiment 1 in having an input terminal 21 for inputting an adjustment voltage Vd from the outside in order to allow the gate current I to the switching element 1 to be externally controlled. The input terminal 21 is connected to the other input terminal of the second operational amplifier 12 via a voltage adjustment resistor R14. In addition to the Zener diode 10, a voltage adjustment resistor R13 is connected to the output terminal of the first operational amplifier 9.

With such a configuration, the current adjustment voltage Vb based on the output voltage of the first operational amplifier 9 can be corrected by using the adjustment voltage Vd inputted through the input terminal 21. The current adjustment voltage Vb that has been corrected by using the adjustment voltage Vd is applied to the other input terminal of the second operational amplifier 12, whereby the gate voltage applied from the second operational amplifier 12 to the MOSFET 7 is adjusted to control the gate current I to the switching element 1.

By so doing, it is possible not only to adjust the magnitude of the gate current to the switching element 1 on the basis of a detection output of the temperature detection circuit 4, but also to adjust the magnitude of the gate current to the switching element 1 on the basis of the condition other than the temperature by using the adjustment voltage Vd inputted through the input terminal 21.

It should be noted that it is possible to adjust the ratio of adjustment of change of the gate current to the switching element 1 based on the adjustment voltage Vd inputted from the outside and the ratio of adjustment of change of the gate current to the switching element 1 by the output voltage of the first operational amplifier 9 based on the detection output of the temperature detection circuit 4, on the basis of the resistors R13 and R14 or the gain of the first operational amplifier 9.

That is, the magnitude of the gate resistance upon turning ON the switching element 1 is determined on the basis of the size of the resistor R2 and the ON resistance of the MOSFET 7, and the magnitude of the gate resistance upon tuning OFF the switching element 1 is determined on the basis of the size of the resistor R3 and the ON resistance of the MOSFET 8. Therefore, it is possible not only to adjust the value of the above resistor in accordance with the characteristic of the switching element 1 to be driven, but also to adjust the gate current I to the switching element 1 on the basis of the temperature state of the switching element 1 and the magnitude of the adjustment voltage Vd inputted from the outside to the input terminal 21.

The other configurations and operational effects are the same as those in Embodiment 1, and thus the detailed description thereof is omitted.

Embodiment 4

Figure 7:
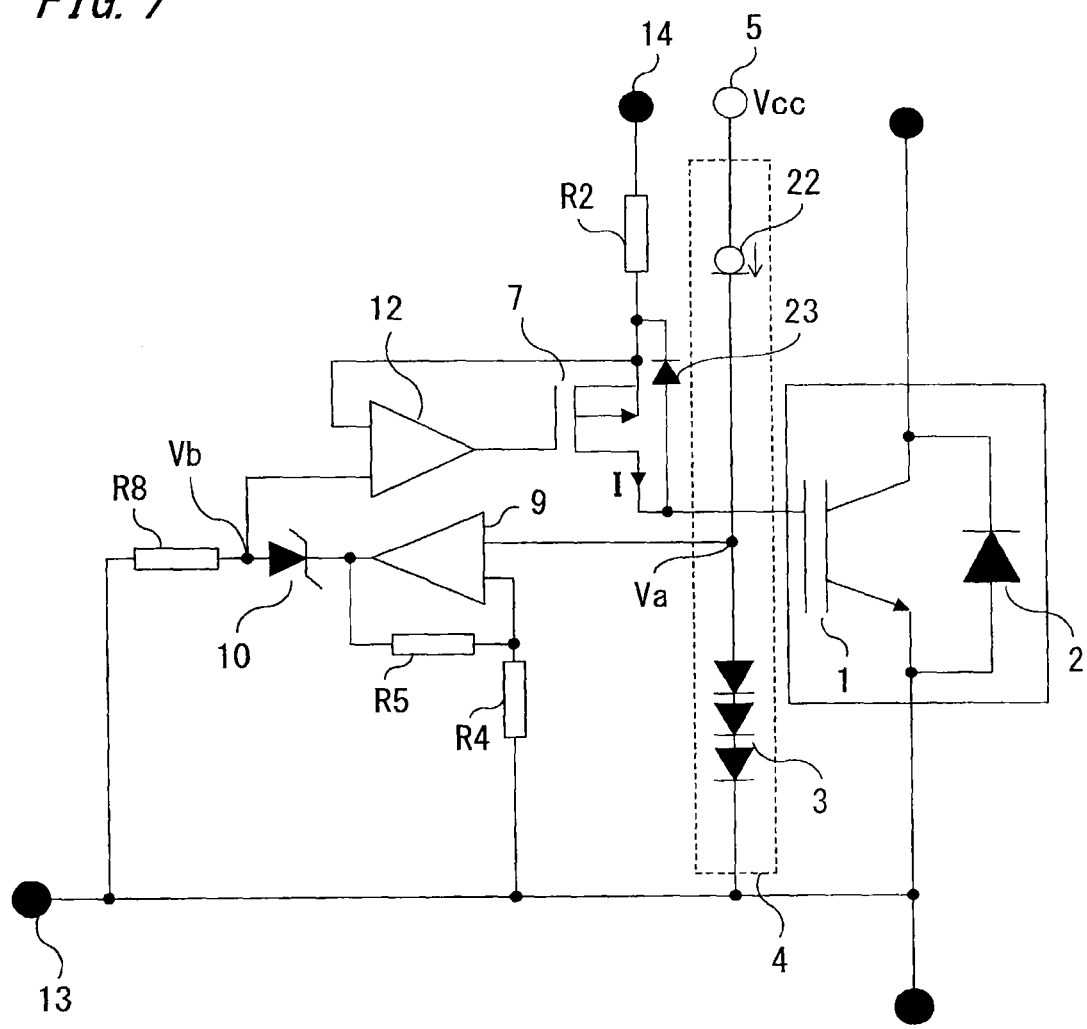
FIG. 7 is a circuit diagram showing a gate driving circuit according to Embodiment 4 of the present invention.

FIG. 7 is a circuit diagram showing a gate driving circuit according to Embodiment 4 of the present invention, and components that correspond to or are the same as those in Embodiment 1 shown in FIG. 1 are denoted by the same reference characters.

Embodiment 4 is different from Embodiment 1 in that a constant current diode 22 is provided between the control power supply 5 and the diodes 3 of the temperature detection circuit 4 in order to adjust the current flowing in the temperature detection circuit 4. In addition, the input terminal 14 for a control signal inputted from the outside for performing ON/OFF control of the switching element 1 is connected via the current limiting resistor R2 to the source side of the MOSFET 7 which forms the current adjustment circuit.

Furthermore, in the case of this configuration, in order to turn OFF the MOSFET 7 to prevent the gate current applied to the switching element 1 from being discharged when a control signal having an L level with the same ground voltage as that at the ground side terminal 13 is inputted to the input terminal 14, a turn-off diode 23 is connected in parallel with the MOSFET 7. This ensures that the switching element 1 is turned OFF when a control signal having the same L level as that at the ground side terminal 13 is inputted to the input terminal 14.

It should be noted that a body diode of the MOSFET 7 may be used instead of connecting the turn-off diode 20 in parallel with the MOSFET 7. In addition, in the case where the value of the current limiting resistor R2 is low, a resistor may be connected in series with the resistor R2 and in series with the turn-off diode 23.

In the configuration of Embodiment 4, when a control signal having an H level with a voltage equal to or higher than a voltage with which the switching element 1 is turned ON is inputted through the input terminal 14, the gate voltage of the MOSFET 7 is adjusted by the second operational amplifier 12 such that a potential difference between the amplitude of the control signal and the current adjustment voltage Vb occur at both ends of the current limiting resistor R2. By so doing, the magnitude of the gate current I to the switching element 1 is adjusted, and the switching element 1 is turned ON. Meanwhile, when a control signal having an L level with the same ground voltage as that at the ground side terminal 13 is inputted to the input terminal 14, the MOSFET 7 is turned OFF, and thus the switching element 1 is turned OFF.

Regarding the Zener diode 10, as described in the case of Embodiment 1, it is possible to adjust the tendency of correction of the gate current I on the basis of the positive or negative characteristic of the Zener diode 10 to be used. In this case, the Zener diode 10 may be configured to be disposed on the chip on which the switching element 1 is disposed, or may be disposed on another chip different from this chip. For example, the Zener diode 10 may be disposed near the radiation fin which cools the switching element 1.

Thus, it is possible to make the magnitude of the gate current I to the switching element 1 variable on the basis of the chip temperature of the switching element 1 and the ambient temperature to automatically adjust the switching speed of the switching element 1. As a result, it is possible to automatically adjust a trade-off between switching noise and switching loss on the basis of a control signal inputted from the outside to the input terminal 14, to drive the switching element 1.

The present invention is not limited to only the configurations of Embodiments 1 to 4 described above, and various modifications can be made or some components can be omitted in Embodiments 1 to 4 described above without departing from the gist of the present invention. In addition, the configurations of Embodiments 1 to 4 can be combined as appropriate.

In Embodiments 1 to 4 described above, the semiconductor elements such as the switching element 1 are shown as ones formed from silicon, but are not limited thereto and may be formed from a wide bandgap semiconductor material having a wider bandgap than that of silicon. Examples of such a wide bandgap semiconductor material include silicon carbide, a gallium-nitride-based material, and diamond.

The semiconductor elements, such as the switching element 1, which are formed from such a wide bandgap semiconductor material have high voltage resistance and a high allowable current density, and thus can be reduced in size. By using the size-reduced switching element 1 and the like, it is possible to reduce the size of a semiconductor module into which these elements are incorporated. In addition, the semiconductor elements have high heat resistance, and thus it is possible to reduce the size of a radiation fin of a heat sink and to reduce the size of a water-cooling portion. Furthermore, the semiconductor elements have low power loss, thus it is possible to increase the efficiency of the switching elements and the diodes, and further it is possible to increase the efficiency of the semiconductor module.

Meanwhile, the switching element 1 formed from the wide bandgap semiconductor material tends to cause more switching noise than a switching element formed from silicon, and thus it is particularly effective to apply the present invention to such a switching element 1.

The invention claimed is:

1. A gate driving circuit for driving a power conversion switching element by charging and discharging a gate electrode of the switching element, the gate driving circuit comprising:
   a temperature detection circuit for detecting a temperature of the switching element;
   a current source for causing a forward current to flow to the temperature detection circuit;
   an amplifier circuit for amplifying a forward voltage of the temperature detection circuit and adjusting the amplified voltage in accordance with an offset voltage;
   a current adjustment circuit for adjusting a magnitude of a gate current caused to flow to the gate electrode of the switching element, on the basis of an output voltage of the amplifier circuit; and
   a drive circuit for receiving an external signal and turning ON/OFF the switching element, wherein
   the magnitude of the gate current caused to flow from the current adjustment circuit to the gate electrode of the switching element is adjusted on the basis of a change in a magnitude of the forward voltage corresponding to a change in the temperature of the temperature detection circuit,
   the amplifier circuit includes a first operational amplifier and a Zener diode that is provided between the first operational amplifier and the current adjustment circuit,
   the first operational amplifier amplifies the forward voltage of the temperature detection circuit, and
   the Zener diode adjusts the amplified voltage in accordance with an offset voltage.

2. The gate driving circuit according to claim 1, wherein
   a magnitude of a change in the forward voltage caused by a change in the temperature of the temperature detection circuit after the amplification by the first operational amplifier is corrected on the basis of a magnitude of a breakdown voltage of the Zener diode, and
   the current adjustment circuit adjusts the magnitude of the gate current caused to flow to the gate electrode of the switching element, on the basis of the voltage after the correction.

3. The gate driving circuit according to claim 1, wherein the Zener diode is disposed at a radiation fin for cooling the switching element.

4. The gate driving circuit according to claim 1, further comprising a constant current generator for causing a constant current to flow in the temperature detection circuit, wherein
   the constant current generator includes a resistor, a current adjustment semiconductor element, and a third operational amplifier, and
   the current adjustment semiconductor element is controlled by the third operational amplifier such that a voltage drop at the resistor is constant.

5. The gate driving circuit according to claim 1, further comprising an input terminal for adjusting an input voltage to the current adjustment circuit by using an adjustment voltage inputted from outside, wherein
   the magnitude of the gate current to the switching element is adjusted by the current adjustment circuit on the basis of the adjustment voltage inputted through the input terminal.

6. The gate driving circuit according to claim 1, wherein the temperature detection circuit is configured on a chip on which the switching element is configured.

7. The gate driving circuit according to claim 1, wherein the temperature detection circuit includes a diode.

8. The gate driving circuit according to claim 1, wherein the switching element is formed from a wide bandgap semiconductor material.

9. The gate driving circuit according to claim 8, wherein the wide bandgap semiconductor material is one of silicon carbide, a gallium-nitride-based material, and diamond.

* * * * *